(12) United States Patent
West et al.

(10) Patent No.: US 6,649,827 B2
(45) Date of Patent: Nov. 18, 2003

(54) RADIO FREQUENCY SHIELD ENCLOSURE FOR A PRINTED CIRCUIT BOARD

(75) Inventors: David Owen West, San Diego, CA (US); Michael Berner, Wiernsheim (DE); Kenneth Lawrence Weselake, San Diego, CA (US)

(73) Assignees: Siemens Information & Communication Moblie, LLC, San Diego, CA (US); Haerter Stanztechnik GmbH, Koeningsbach-Stein (DE)

( * ) Notice: Subject to any disclaimer, the term of this patent is extended or adjusted under 35 U.S.C. 154(b) by 16 days.

(21) Appl. No.: 09/967,777

(22) Filed: Sep. 28, 2001

(65) Prior Publication Data

US 2003/0062178 A1 Apr. 3, 2003

(51) Int. Cl.$^7$ ................................................ H05K 9/00
(52) U.S. Cl. ...................... 174/35 R; 361/800; 361/818
(58) Field of Search .................... 174/35 R, 35 GC; 361/752, 753, 799, 800, 816, 818, 796

(56) References Cited

U.S. PATENT DOCUMENTS

| | | | | |
|---|---|---|---|---|
| 5,436,802 A | * | 7/1995 | Trahan et al. | 361/816 |
| 5,844,784 A | * | 12/1998 | Moran et al. | 361/818 |
| 5,895,884 A | * | 4/1999 | Davidson | 174/35 R |
| 6,136,131 A | | 10/2000 | Sosnowski | |
| 6,320,121 B1 | * | 11/2001 | Honeycutt et al. | 174/35 R |
| 6,377,472 B1 | | 4/2002 | Fan | |
| 6,377,475 B1 | | 4/2002 | Reis | |

* cited by examiner

Primary Examiner—Dean A. Reichard
Assistant Examiner—Carmelo Oliva

(57) ABSTRACT

A radio frequency shield enclosure (100) is mounted on a printed circuit board and is adapted to allow optical checking of the components enclosed by the shield enclosure (100). A cover (402) is removably attached to a frame (102) on the printed circuit board for access to the printed circuit board components therein. Material and spring forces are selected to minimize the forces on the printed circuit board when attaching or removing the shield enclosure cover (402). Any openings or gaps in the radio frequency shield enclosure cover (402) are small enough to prevent radio frequency energy at the highest anticipated frequency from being radiated outside of the radio frequency shield enclosure (100).

24 Claims, 9 Drawing Sheets

RADIO FREQUENCY SHIELD ENCLOSURE FOR A PRINTED CIRCUIT BOARD

BACKGROUND OF THE INVENTION

The present invention relates generally to radio frequency shield enclosures, and more particularly to a radio frequency shield enclosure mounted onto a printed circuit board and having a removable cover.

Radio frequency shielding, e.g., shielding chambers or enclosures, in electronic equipment such as mobile telephones is necessary in order to reduce receiver radio frequency interference from digital circuit switching noise and malfunction of the digital circuits from locally transmitted radio frequency signals. In addition, shielding may be required for circuit protection from externally generated radio frequency and electromagnetic interference. These shielding chambers may be formed by a frame soldered on a printed circuit board and a mechanically attached cover (lid).

Typically, the frame is placed onto the printed circuit board along with the electronic components using standard SMD pick-and-place technology equipment on the production line before the printed circuit board goes through re-flow soldering. Then optical inspection is performed to ensure proper placement of the components. After passing the optical inspection, a functional electrical test is performed on the printed circuit board. If the functional electrical test is passed, then a separate shield cover is mechanically placed onto the frame.

Having to mechanically assemble the cover onto the frame after re-flow soldering and testing may cause bending of the printed circuit board that may result in excessive stresses thereto. These stresses may damage the printed circuit board conductors, connections and/or components thereon, leading to premature failure of the product. There may also be a problem with signal leakage during the testing phase because the shield cover has not yet been placed onto the frame.

What is needed is a shielding chamber that does not create unnecessary stress on the printed circuit board during assembly and testing, allows optical inspection of components placed onto the printed circuit board, can be easily opened for reworking of the printed circuit board if problems are found during testing, may be easily closed up to maintain radio frequency shielding without damaging the printed circuit board and/or components thereon, and effectively shield all frequencies up to the highest frequency of operation or concern of the radio frequency device.

SUMMARY OF THE INVENTION

The invention overcomes the above-identified problems as well as other shortcomings and deficiencies of existing technologies.

According to one embodiment, the present invention provides a radio frequency shield enclosure having a removable cover. The enclosure includes a frame adapted for attachment to a printed circuit board; and a cover having a plurality of openings, a plurality of grounding finger contacts, and a plurality of alignment finger contacts. The plurality of alignment finger contacts mate with alignment locations on the frame to align the cover therewith, and the plurality of grounding finger contacts electrically connect the cover to the frame. The cover openings and spaces between the plurality of grounding finger contacts and the plurality of alignment finger contacts are less than a wavelength of a frequency of operation and concern.

According to another specific embodiment, the present invention also provides a method of operation for assembling a radio frequency shield enclosure having a removable cover to a printed circuit board. The method includes the steps of fabricating a frame adapted for attachment to a printed circuit board; fabricating a cover having a plurality of openings, a plurality of grounding finger contacts, and a plurality of alignment finger contacts; and assembling the frame and cover together before attaching to the printed circuit board. The plurality of alignment finger contacts mate with alignment locations on the frame to align the cover therewith. The plurality of grounding finger contacts electrically connect the cover to the frame, whereby the cover openings and spaces between the plurality of grounding finger contacts and the plurality of alignment finger contacts are less than a wavelength of a frequency of operation and concern.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawing, wherein:

FIG. 8b illustrates an enlarged orthogonal view of the corner of the shield frame depicted in FIG. 8a;

FIG. 9b illustrates an enlarged orthogonal view of the corner of the shield cover depicted in FIG. 9a.

DETAILED DESCRIPTION OF SPECIFIC EMBODIMENTS

Figure 1:
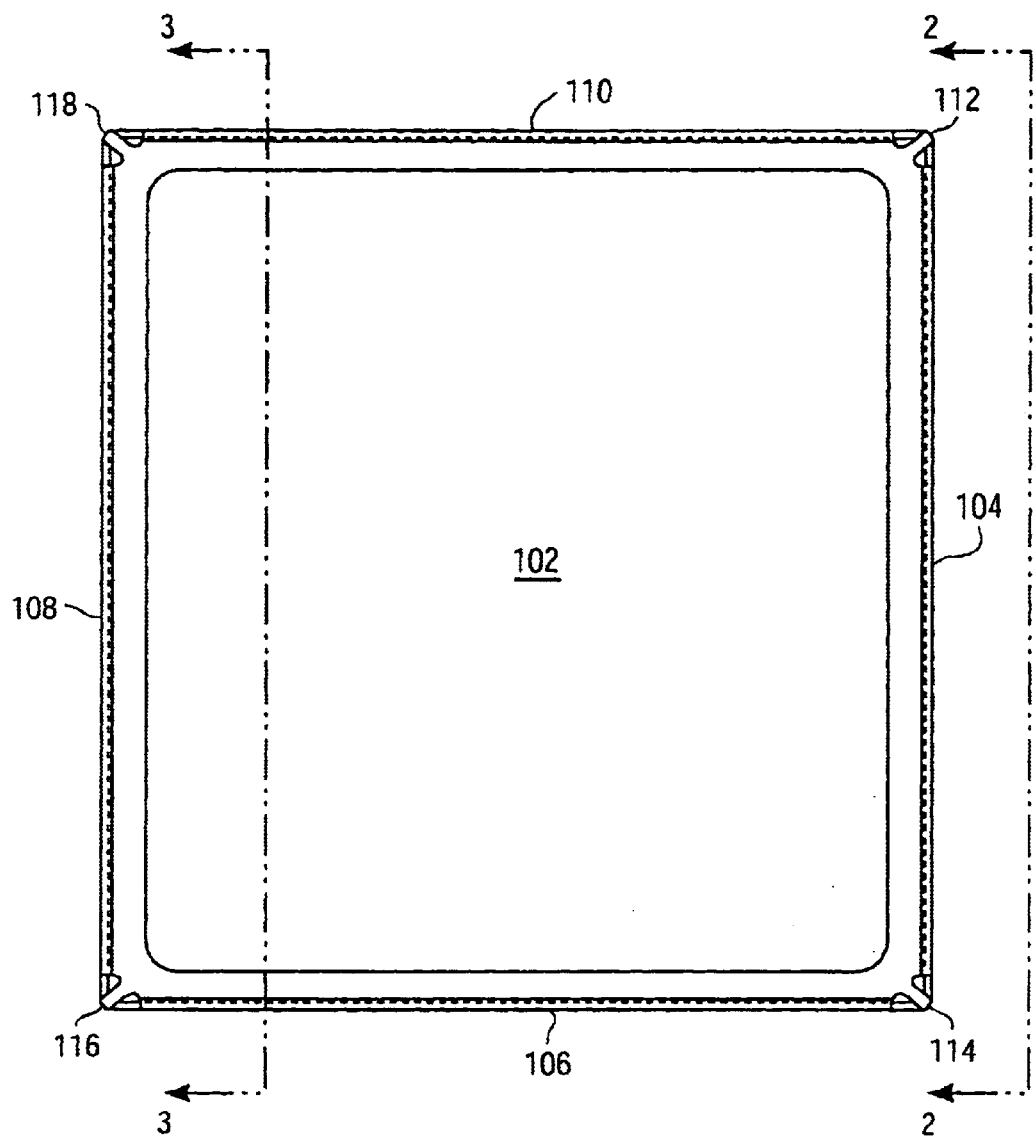
FIG. 1 illustrates a schematic plan view of a shield frame, according to an exemplary embodiment of the invention.

While the present invention is susceptible to various modifications and alternative forms, specific exemplary embodiments thereof have been shown by way of example in the drawing and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

The present invention is directed to a radio frequency shield enclosure for a printed circuit board that provides shielding for electrical circuits. An exemplary embodiment of the invention may be a stamped sheet metal frame and cover that is rectangular in shape with a combination of springingly biased grounding contacts and a series of openings in the cover that are less than a wavelength of the highest frequency of operation and concern. The openings in the cover are spaced accordingly to minimize the amount of material between the openings as defined by design constraints in accordance with metal stamping process limitations. The grounding contact widths are minimized to reduce contact spring force on the frame. The grounding contacts are spaced such that the grounding contact points of the cover and frame are less than a wavelength of the highest frequency of operation and concern so as to substantially minimize radio frequency signal leakage.

The shield enclosure may be made of any material that is electrically conductive to radio frequency signals and is easily solderable when placed onto a printed circuit board during re-flow soldering. A preferred material may comprise a metal alloy, such as copper-nickel-zinc, e.g., $CuNi_{18}Zn_{20}$ ($F_{58}$).

For proper alignment of the cover with the frame there are alignment spring fingers having concave or convex dimples adapted for aligning with corresponding convex or concave dimples, respectively, in the frame. The widths of the spring contacts (or fingers) are minimized so as to reduce spring force on the frame. The spring contacts are spaced such that the grounding contact points between the frame and cover are less than a wavelength of the highest frequency of operation and concern. Alternatively, the frame may have alignment holes adapted for engagement with corresponding convex dimples in the alignment fingers of the cover. The spring contacts or dimpled alignment spring fingers may be at the corners and spaced evenly between the corners along the edges of the cover and may provide additional grounding contacts between the cover and frame. The frame and/or cover may have each side of a corner connected together so that there are no openings greater than or equal to a wavelength of the highest frequency of operation and concern.

According to the specific embodiment, the invention provides a sheet metal frame and mechanically attached cover that may be automatically assembled in a stamping production line, e.g., the fully assembled shielding enclosure is delivered on a conveyor and directly installed on a printed circuit board before re-flow soldering of the printed circuit board. The series of openings in the cover allow optical inspection of the printed circuit board and components thereon without having to remove the cover from the frame attached to the printed circuit board. The dimensions of these openings are smaller than a wavelength of the highest frequency of operation and concern (a frequency of concern may be the frequency of any potentially interfering signal no matter where this interfering signal originates). Since the shielding enclosure is fully assembled before being placed onto the printed circuit board, no stress to the printed circuit board is applied during assembly. Better testing results are obtained because the shielding enclosure is fully functional with its cover already in place. If rework of the printed circuit board is required, the present invention is adapted to have reduced spring force contacts on the cover to help minimize the amount of bending stress to the printed circuit board during removal and replacement of the shield cover.

A method of manufacture, according to an exemplary embodiment of the invention, allows fabrication and assembly of the radio frequency shield enclosure before attaching it to a printed circuit board. After placement of the assembled radio frequency shield enclosure on the printed circuit board, the entire printed circuit board and shield assembly may be re-flow soldered along with all of the other pick and place components on the printed circuit board. Once the re-flow soldering operation is performed and the assembly is cleaned, the assembly may be optically inspected for proper parts placement and fully electrically tested. If all inspections and tests are passed then the finished and tested assembly may go straight to final product assembly, shipping or to inventory for subsequent product assembly. If any optical inspection or electrical test fails, then the shield cover may be easily removed and the printed circuit board can be re-worked or repaired before re-attaching the shield cover. The finger contacts on the shield cover are designed to minimize removal and attachment forces on the frame and printed circuit board. Proper alignment of the cover to the frame is assured by the mating dimple surfaces on the alignment finger contacts of the shield cover.

Thus, the present invention has various advantages such as simplification of the construction/assembly process and the testing process, reduced stress on a printed circuit board, and/or allowing optical inspection of components on a printed circuit board with the cover in place. Other advantages include reduced radio frequency leakage therethrough, reduced damage to the printed circuit board during fabrication and testing, all testing (such as electrical circuit testing) can be done with radio frequency shields in place, and the shield cover can be removed and replaced without excessive stress to the printed circuit board. A feature of the present invention is an assembled shield enclosure that may be re-flow soldered with other components on a printed circuit board. Another feature is that there is reduced force and stress on the printed circuit board when removing or replace the shield cover.

Referring now to the drawings, the details of exemplary embodiments of the present invention are schematically illustrated. Like elements in the drawings will be represented by like numbers, and similar elements will be represented by like numbers with a different lower case letter suffix.

Referring to FIG. 1, depicted is a schematic plan view of a shield frame, according to an exemplary embodiment of the invention. The shield frame is generally represented by the numeral 102. The shield frame 102 comprises four sides 104, 106, 108 and 110 attached together at corners 112, 114, 116 and 118. As depicted in FIG. 1, the shield frame 102 is rectangular, however, any shape, e.g., rectangular, square, round ellipsoidal, may be used and is contemplated herein. The shield frame 102 is open inside so that the shield 102 may enclose printed circuit board components when the shield frame 102 is placed onto a printed circuit board (not illustrated).

Figure 2:
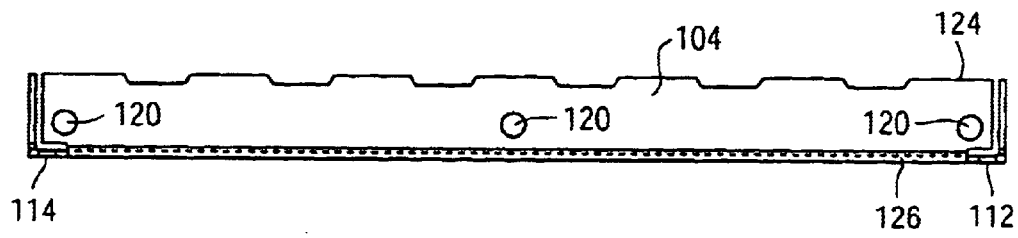
FIG. 2 illustrates a schematic elevational view of cross section 2—2 of FIG. 1.

Referring to FIG. 2, depicted is a schematic elevational view of cross section 2—2 of FIG. 1. Representative of each of the sides, the side 104 comprises a vertical portion 124 and a horizontal portion 126 approximately perpendicular to one another. The horizontal portion 126 is adapted to be re-flow soldered to a corresponding conductive area on the printed circuit board (not illustrated). The vertical portion 124 has alignment holes or dimples 120 toward each corner and evenly spaced between the corners, e.g., 112 and 114. These alignment holes or dimples 120 are used in combination with corresponding dimples on the shield cover (FIG. 4) to obtain proper alignment of the cover with the frame 102.

Figure 3:
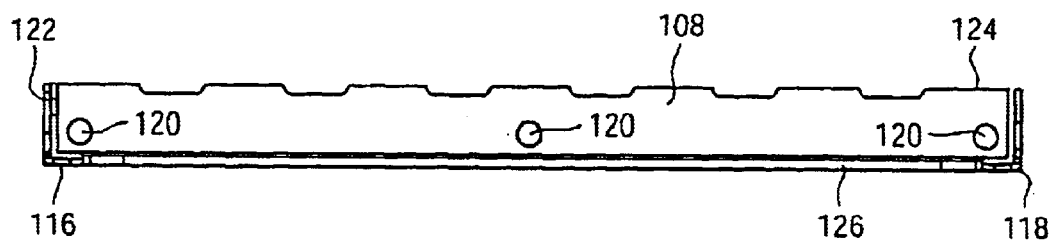
FIG. 3 illustrates a schematic elevational view of cross section 3—3 of FIG. 1.

Referring to FIG. 3, depicted is a schematic elevational view of cross section 3—3 of FIG. 1. A connection 122 at the corners of the frame 102 may be used to maintain an opening at the corner that is less than a wavelength of the highest frequency of operation or concern. The connection 122 may be a spot weld, a folded metal tab interlocking connection, etc.

Figure 4:
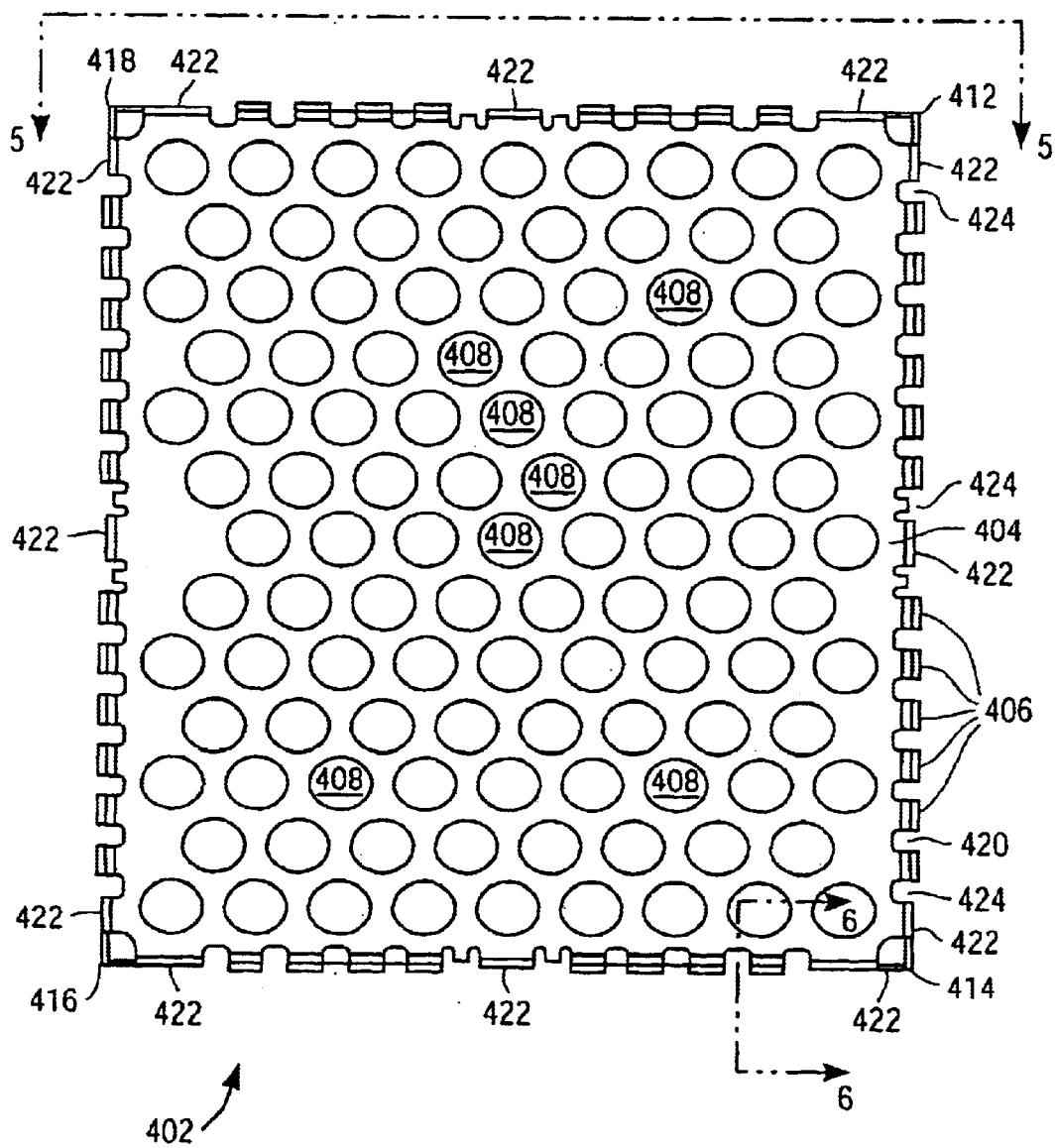
FIG. 4 illustrates a schematic plan view of a shield cover, according to an exemplary embodiment of the invention.

Referring to FIG. 4, depicted is a schematic plan view of a shield cover, according to an exemplary embodiment of the invention. The shield cover is generally represented by the numeral 402. The shield cover 402 comprises a top 404, a plurality of grounding finger contacts 406, a plurality of alignment finger contacts 422 and openings 408. As depicted in FIG. 4, the shield cover 402 is rectangular, however, any shape that corresponds to the shield frame 102 may be used and is contemplated herein. The grounding finger contacts 406 are located such that spaces 420 between the grounding finger contacts 406 are less than a wavelength of the highest frequency of operation and concern. The alignment finger contacts 422 are located such that spaces 424 between the alignment finger contacts 422 and adjacent grounding finger contacts 406 are less than a wavelength of the highest frequency of operation and concern. Openings 408 also have a diameter less than a wavelength of the highest frequency of operation and concern. For example, for a wavelength of 1900 MHz frequency of operation, the diameter of openings 408 and the spaces 424 would be less than 1.97 mm according to a preferred embodiment.

Figure 5:
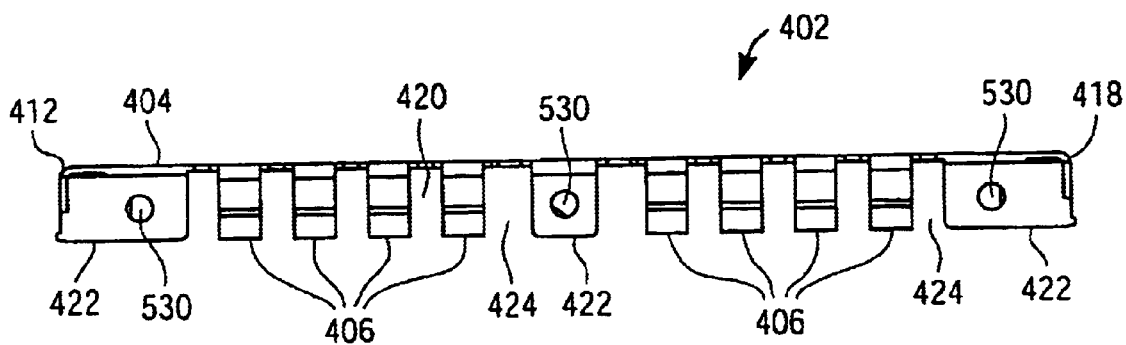
FIG. 5 illustrates a schematic elevational view of cross section 5—5 of FIG. 4.

Referring to FIG. 5, depicted is a schematic elevational view of cross section 5—5 of FIG. 4. Representative of each side of the cover 402, a plurality of grounding finger contacts 406 and a plurality of alignment finger contacts 422 are depicted. The plurality of alignment finger contacts have alignment dimples 530 that may be concave or convex depending upon the form of the corresponding alignment holes or dimples 120 (see FIG. 2).

Figure 6:
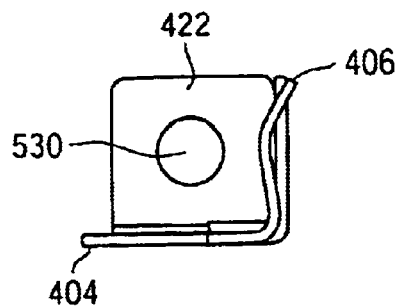
FIG. 6 illustrates a schematic elevational view of cross section 6—6 of FIG. 4.
Figure 7:
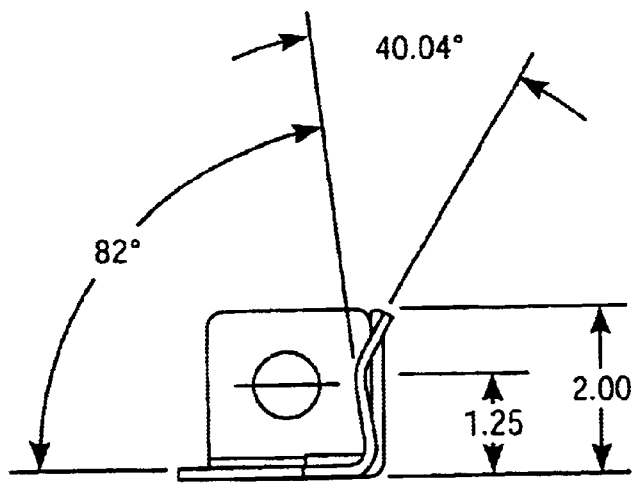
FIG. 7 illustrates a schematic elevational view depicting preferred angles for the grounding contact fingers of the shield cover of FIG. 4.

Referring to FIGS. 6 and 7, depicted is a schematic elevational view of cross section 6—6 of FIG. 4. The grounding finger contact 406 may be bent at a first angle of approximately 82 degrees from the plane of the top 404 and also bent at a second angle of approximately 40.04 degrees from the plane of the portion of the contact 406 bent at the first angle. Other first and second angles may be used and are contemplated herein and are within the scope of the present invention. The purpose of bending the grounding finger contact 406 to the first and second angles is to create a springingly gentle bias of the grounding finger contact 406 against the sides 104–110 of the frame 102. The alignment finger contacts 422 may be approximately 2 mm long and the alignment dimple 530 may be about 1.25 mm from the plane of the cover 402. Other dimensions may be used so long as no opening is equal to or greater than a wavelength of the highest frequency of operation and concern. These other dimensions are contemplated herein and are within the scope of the present invention.

Figure 8A:
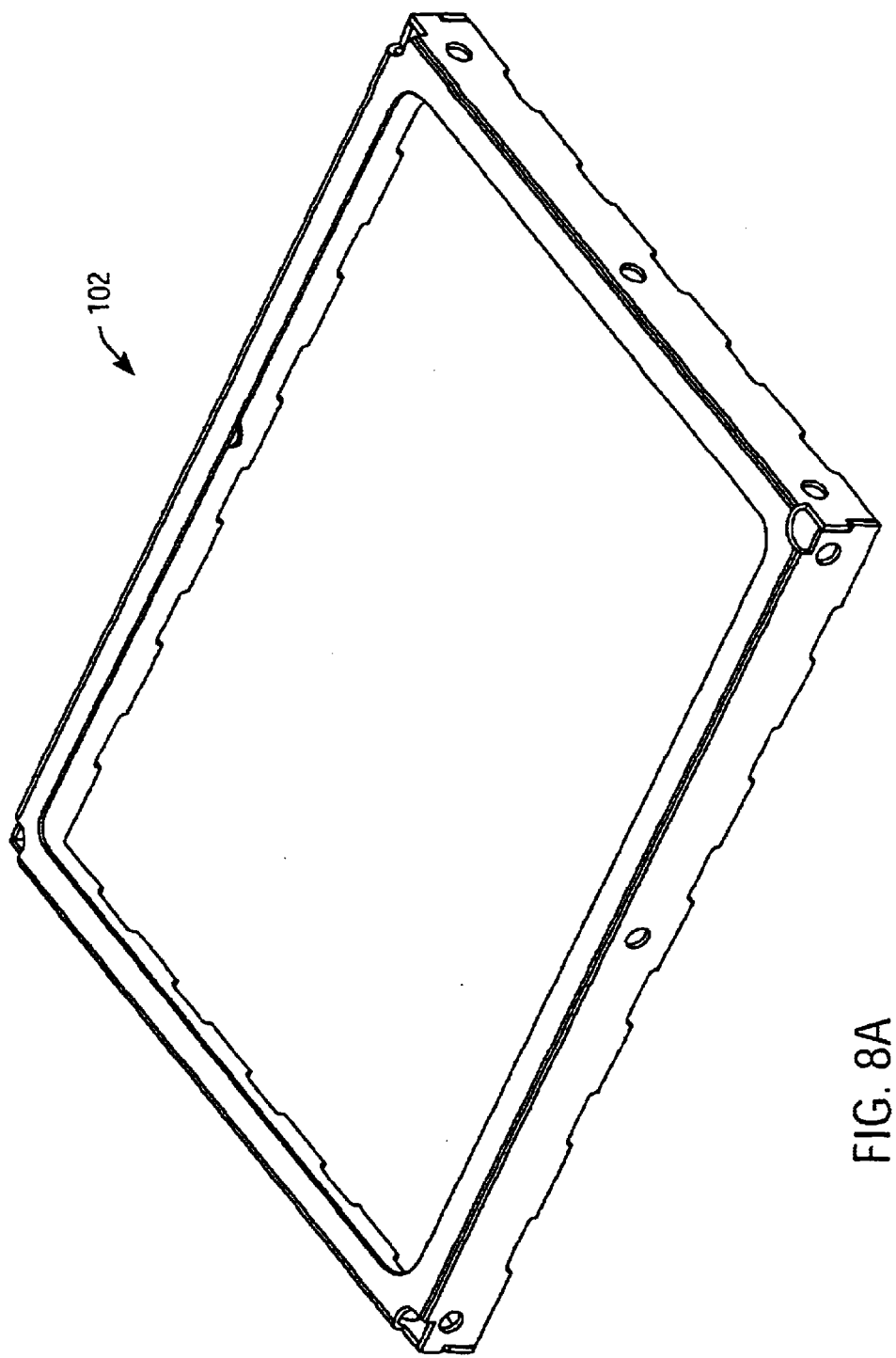
FIG. 8a illustrates an orthogonal view of the shield frame depicted in FIG. 1.
Figure 8B:
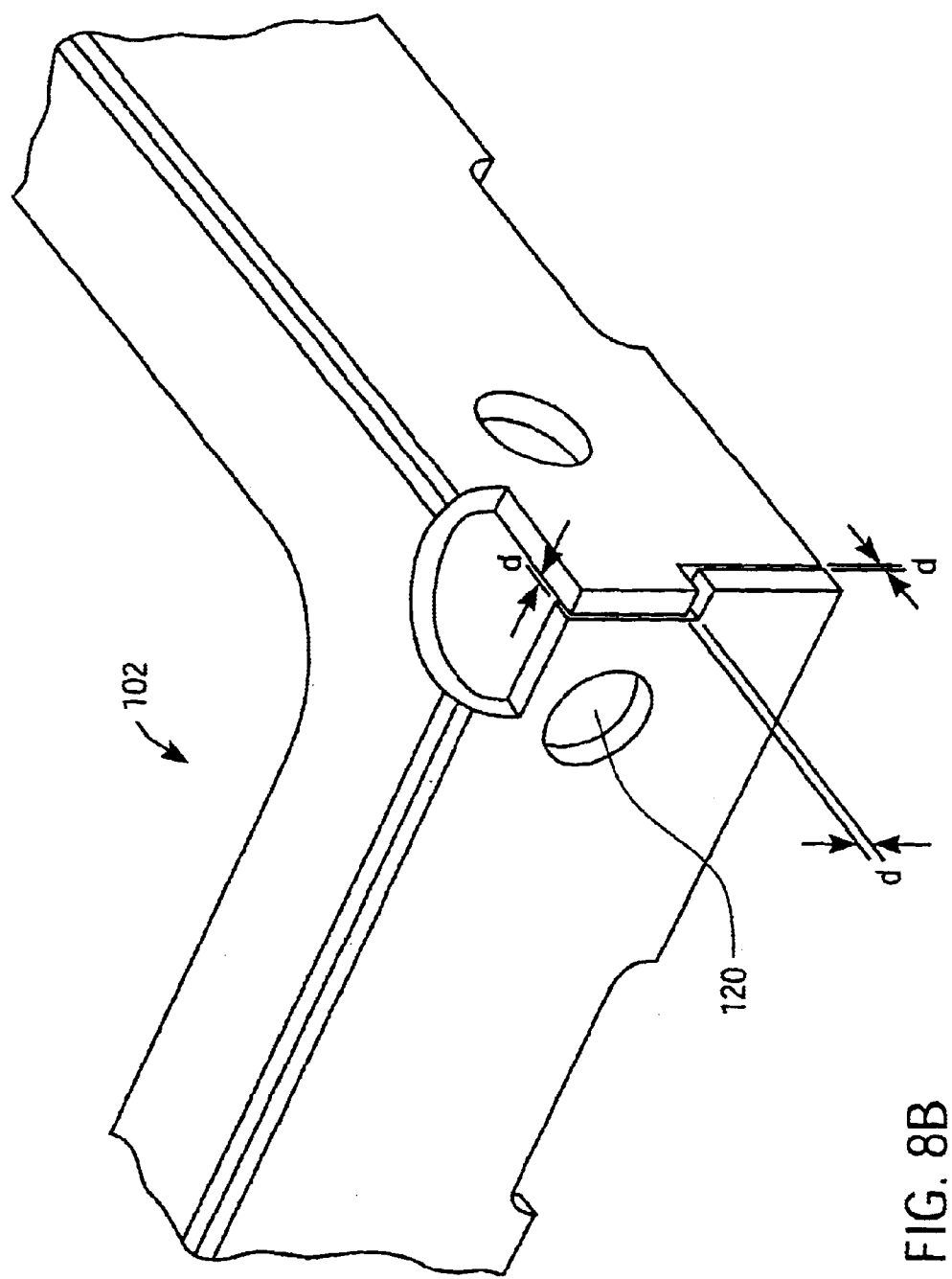

Referring to FIG. 8a, depicted is an orthogonal view of the shield frame depicted in FIG. 1. The shield frame 102 is shown with the face (formed by horizontal portions of sides, including portion 126 of side 104) that comes in contact with the printed circuit board visible. FIG. 8b shows an enlarged orthogonal view of the corner of shield frame 102 of FIG. 8a. As seen in the detailed view of FIG. 8b, the distance between the contact points are shown as spaces "d" in the corner where the vertical sides of shield frame meet. This distance d is the less than the wavelength of the highest frequency of operation or concern. For example, distance d is approximately 1.97 mm in the preferred embodiment where the radio frequency of concern is about 1900 MHz. Of course, other values of distance d can be used depending on the frequencies of operation or concern.

Figure 9A:
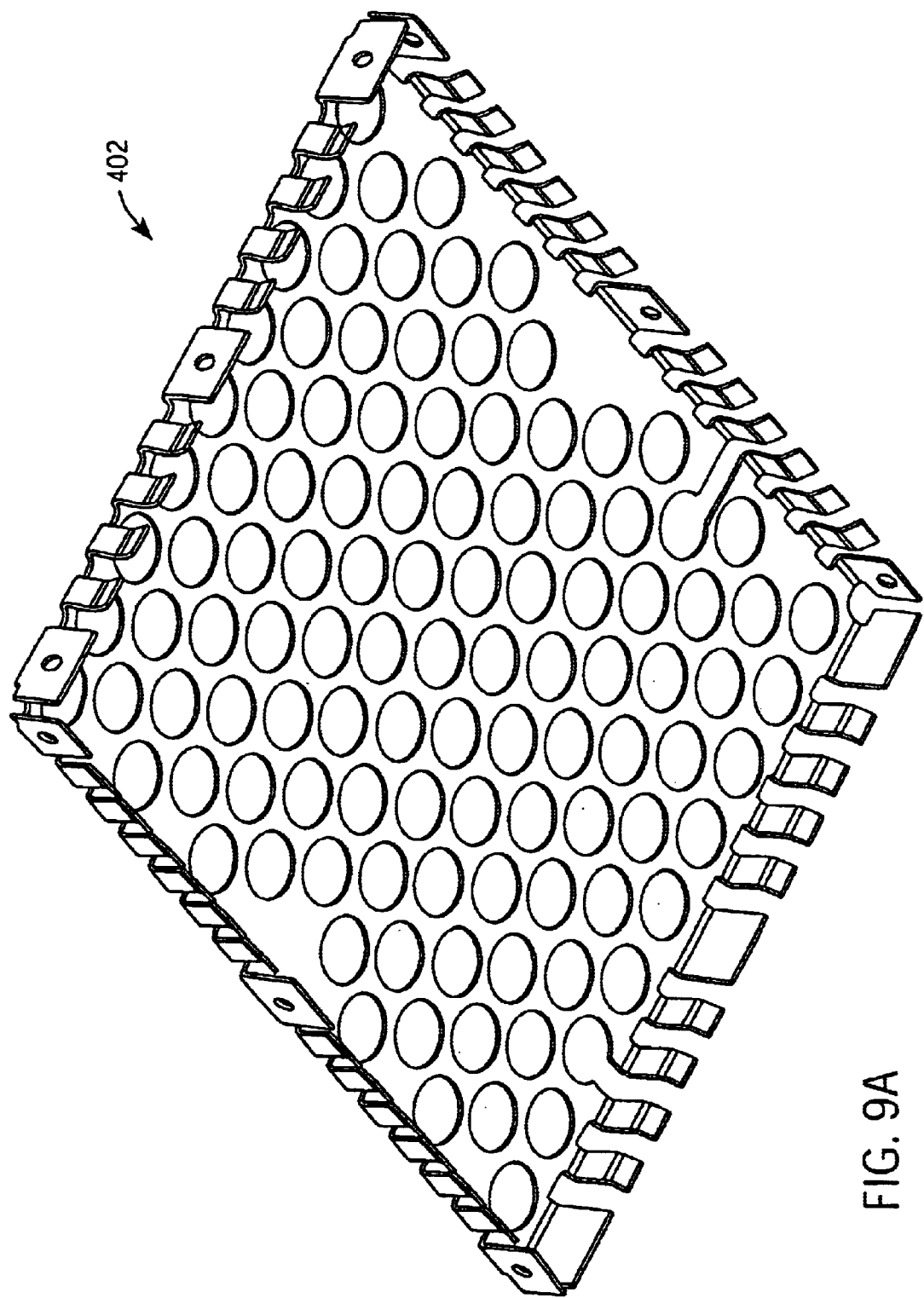
FIG. 9a illustrates an orthogonal view of the shield cover depicted in FIG. 4.
Figure 9B:
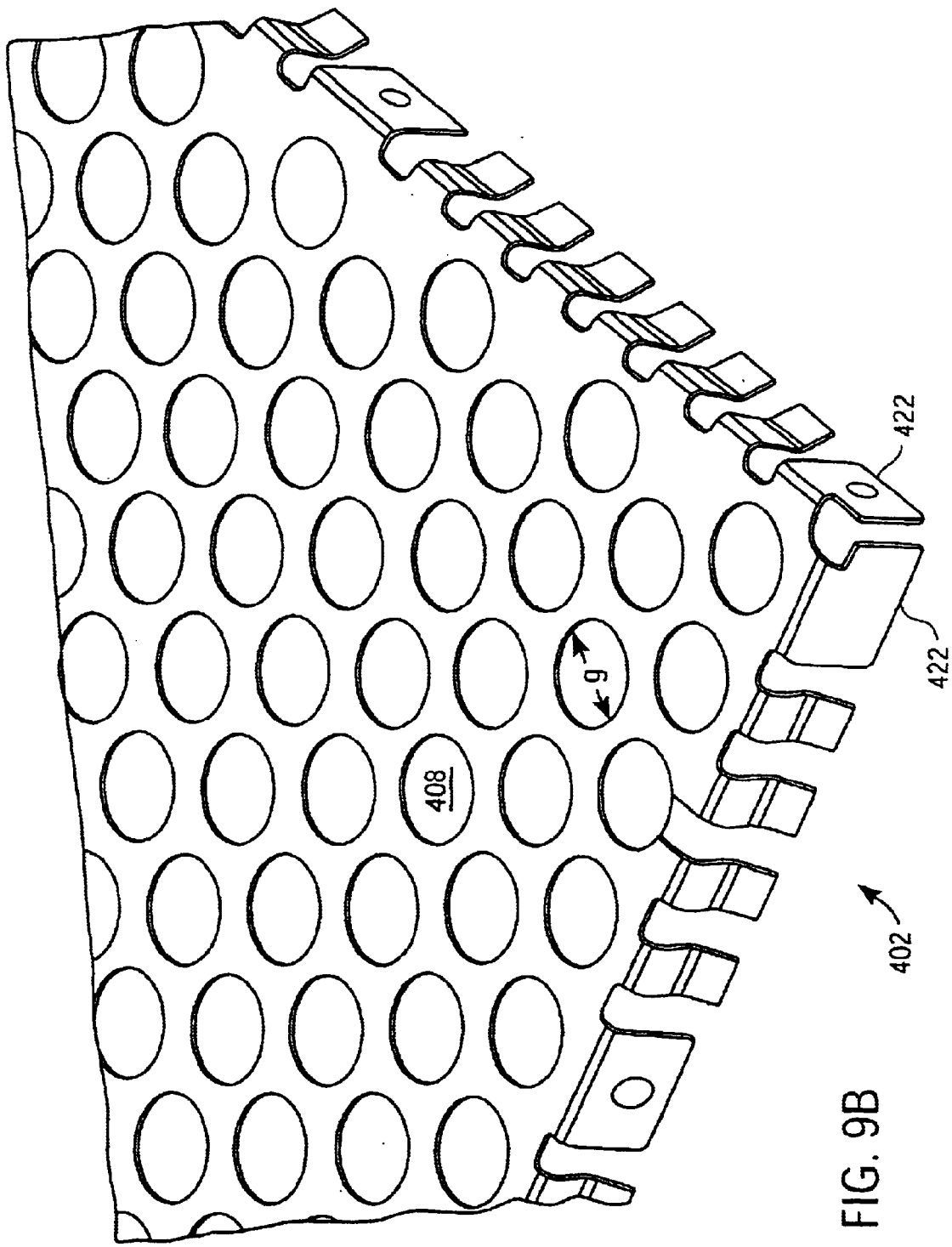

Referring to FIG. 9a, depicted is an orthogonal view of the shield cover depicted in FIG. 4. The shield cover 402 is shown from a top view orthogonal perspective. The openings 408 in the top 404 clearly illustrate the transparency due to openings in the cover 402 for optical inspection of components therein. FIG. 9b shows an enlarged orthogonal view of a corner of the shield cover 402 of FIG. 9a. As mentioned above, the diameter "g" of the openings 408 is less than a wavelength of the highest frequency of operation or concern.

Figure 10:
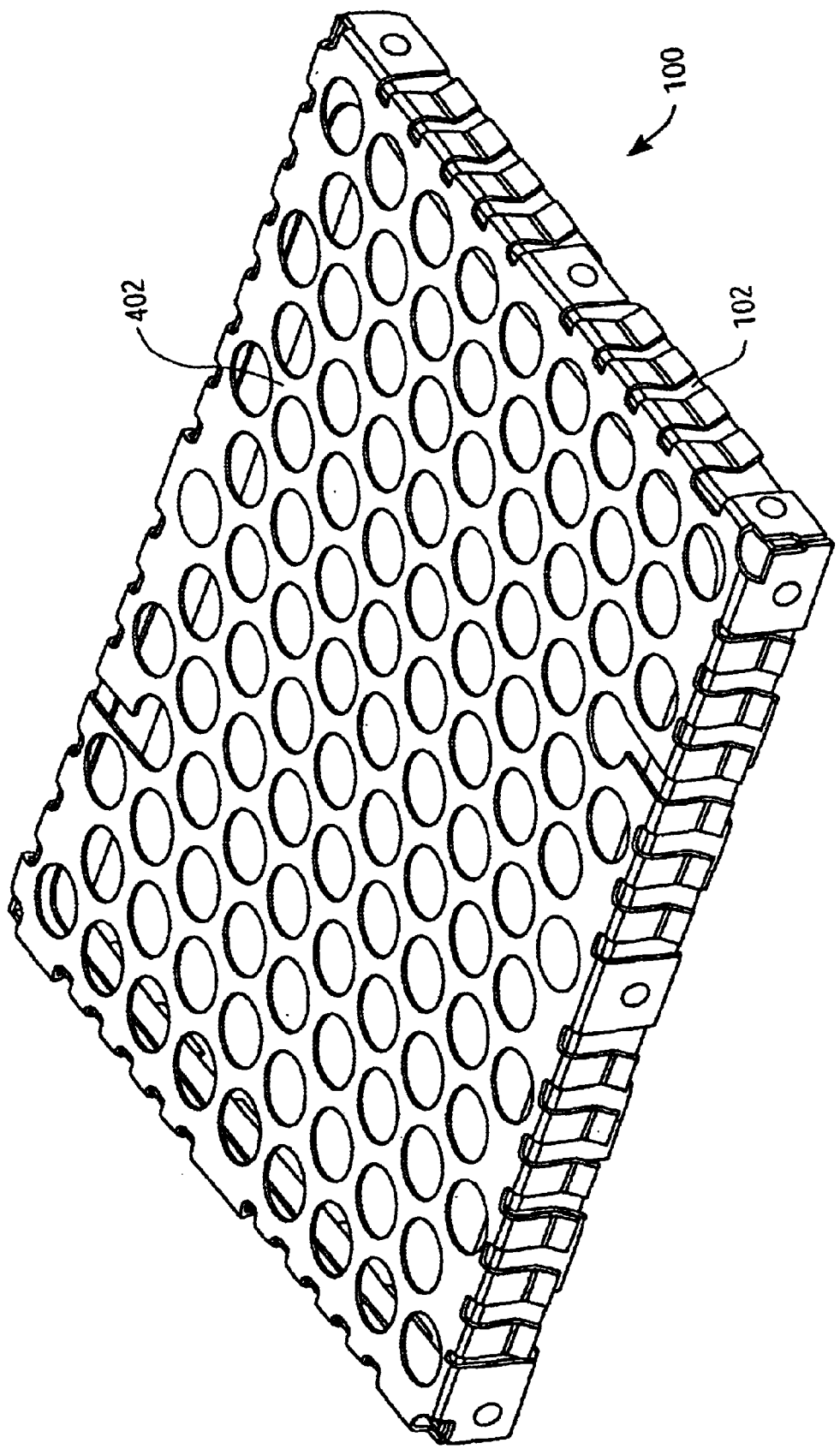
FIG. 10 illustrates an orthogonal view of the shield frame and cover assembled together.

Referring to FIG. 10, depicted is an orthogonal view of the shield frame 102 and cover 402 assembled together to form the radio frequency enclosure 100. The combination of grounding finger contacts 406 and alignment finger contacts 422 create a radio frequency tight enclosure 100 whose cover 402 may be easily removed and replaced if re-work of the printed circuit board components is required.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A radio frequency shield enclosure having a removable cover, comprising:
   a frame adapted for attachment to a printed circuit board; and
   a cover having a plurality of openings, a plurality of grounding finger contacts and a plurality of alignment finger contacts, wherein the plurality of alignment finger contacts mate with alignment locations on said frame to align said cover therewith, and the plurality of grounding finger contacts electrically connect said cover to said frame, whereby the cover openings, spaces between the plurality of grounding finger contacts and the plurality of alignment finger contacts form the radio frequency shield enclosure, wherein the plurality of openings are sized to substantially prevent electromagnetic radio frequency energy from entering and leaving the radio frequency shield enclosure, and the plurality of openings are spaced close enough together so that components within the radio frequency shield enclosure are visually observable.

2. The radio frequency shield enclosure according to claim 1, wherein said frame and said cover are rectangular in shape.

3. The radio frequency shield enclosure according to claim 1, wherein said frame and said cover are square in shape.

4. The radio frequency shield enclosure according to claim 1, wherein said frame and said cover are round in shape.

5. The radio frequency shield enclosure according to claim 1, wherein said frame and said cover are ellipsoidal in shape.

6. The radio frequency shield enclosure according to claim 1, wherein said frame is made of a metal alloy.

7. The radio frequency shield enclosure according to claim 6, wherein the metal alloy is $CuNi_{18}Zn_{20}$ ($F_{58}$).

8. The radio frequency shield enclosure according to claim 1, wherein said cover is made of a metal alloy.

9. The radio frequency shield enclosure according to claim 8, wherein the metal alloy is $CuNi_{18}Zn_{20}$ ($F_{58}$).

10. The radio frequency shield enclosure according to claim 1, wherein widths of the plurality of grounding finger contacts determines the amount of force exerted against said frame.

11. The radio frequency shield enclosure according to claim 1, wherein each of the plurality of grounding finger contacts is springingly biased toward said frame with a first bend and a second bend.

12. The radio frequency shield enclosure according to claim 11, wherein the first bend is at an angle of approximately 82 degrees from a plane parallel with said cover face.

13. The radio frequency shield enclosure according to claim 12, wherein the second bend is at an angle of approximately 40 degrees from a plane parallel with said first angle.

14. The radio frequency shield enclosure according to claim 1, wherein all openings between said cover and said frame are less than a wavelength of the highest frequency of operation and concern.

15. The radio frequency shield enclosure according to claim 1, wherein said frame is made of stamped metal.

16. The radio frequency shield enclosure according to claim 1, wherein said cover is made of stamped metal.

17. The radio frequency shield enclosure according to claim 1, wherein said frame and said cover are assembled together before being attached to the printed circuit board.

18. The radio frequency shield enclosure according to claim 1, wherein the alignment locations on said frame are openings adapted to receive convex dimples on the plurality of alignment fingers of said cover.

19. The radio frequency shield enclosure according to claim 1, wherein the alignment locations on said frame are openings adapted to receive convex dimples on the plurality of alignment fingers of said cover.

20. The radio frequency shield enclosure according to claim 1, wherein the alignment locations on said frame are concave dimples adapted to receive convex dimples on the plurality of alignment fingers of said cover.

21. The radio frequency shield enclosure according to claim 1, wherein the alignment locations on said frame are convex dimples adapted to receive concave dimples on the plurality of alignment fingers of said cover.

22. A method of assembling a radio frequency shield enclosure having a removable cover to a printed circuit board, said method comprising the steps of:

fabricating a frame adapted for attachment to a printed circuit board;

fabricating a cover having a plurality of openings, a plurality of grounding finger contacts and a plurality of alignment finger contacts, wherein the plurality of alignment finger contacts mate with alignment locations on said frame to align said cover therewith, and the plurality of grounding finger contacts electrically connect said cover to said frame, whereby the cover openings, spaces between the plurality of grounding finger contacts and the plurality of alignment finger contacts form the radio frequency shield enclosure, wherein the plurality of openings are sized to substantially prevent electromagnetic radio frequency energy from entering and leaving the radio frequency shield enclosure, and the plurality of openings are spaced close enough together so that components within the radio frequency shield enclosure are visually observable; and assembling the frame and cover together before attaching to the printed circuit board.

23. The method of claim 22, further comprising the step of optically checking components on the printed circuit board through the plurality of openings of said cover.

24. The method of further comprising the steps of removing and replacing the cover when replacing a component on the printed circuit board.

* * * * *